United States Patent
Raible

[11] Patent Number: 6,160,732
[45] Date of Patent: Dec. 12, 2000

[54] INTEGRATED CIRCUIT WITH A CONFIGURATION ASSEMBLY

[75] Inventor: Markus Raible, Munich, Germany

[73] Assignee: Siemens Aktiengesellschaft, Munich, Germany

[21] Appl. No.: 09/408,677

[22] Filed: Sep. 30, 1999

[30] Foreign Application Priority Data

Sep. 30, 1998 [DE] Germany .......................... 198 44 944

[51] Int. Cl.⁷ ..................................................... G11C 5/06
[52] U.S. Cl. .............................. 365/63; 365/51; 365/72; 365/226
[58] Field of Search ................................ 365/51, 63, 72, 365/189.03, 225.7, 226

[56] References Cited

U.S. PATENT DOCUMENTS 5,748,550  5/1998  Jeon et al. ................................ 365/226
5,970,011  10/1999  Shih et al. ................................ 365/226

FOREIGN PATENT DOCUMENTS

| 0520483A1 | 12/1992 | European Pat. Off. | ......... H04Q 3/62 |
| 0622938A2 | 11/1994 | European Pat. Off. | ......... H04M 3/50 |
| 0706279A1 | 4/1996 | European Pat. Off. | ....... H04M 11/06 |
| 3218992C2 | 4/1990 | Germany | ........................ H01L 23/58 |
| 19711720A1 | 10/1998 | Germany | ........................ H04L 12/56 |

OTHER PUBLICATIONS

"Das virtuelle Büro", Andreas Wild, Siemens, telecomreport, pp. 1 to 5.
Japanese Patent Abstract No. 07192979A (Katsunori et al.), dated Jul. 28, 1995.
Published International Application No. 96/31044 (Booton), dated Oct. 3, 1996.

*Primary Examiner*—Andrew Q. Tran
*Attorney, Agent, or Firm*—Herbert L. Lerner; Laurence A. Greenberg; Werner H. Stemer

[57] ABSTRACT

The integrated circuit has a functional assembly, such as a memory, and a configuration assembly for configuring the functional assembly. The inputs of the configuration assembly can be connected to the control voltage via at least one integrated switch. On the control side, the switch is connected to an evaluation circuit, which, on the input side, is connected to at least one pad. The evaluation circuit detects a configuration signal present at the pad and converts it into a control signal for the switch.

9 Claims, 1 Drawing Sheet

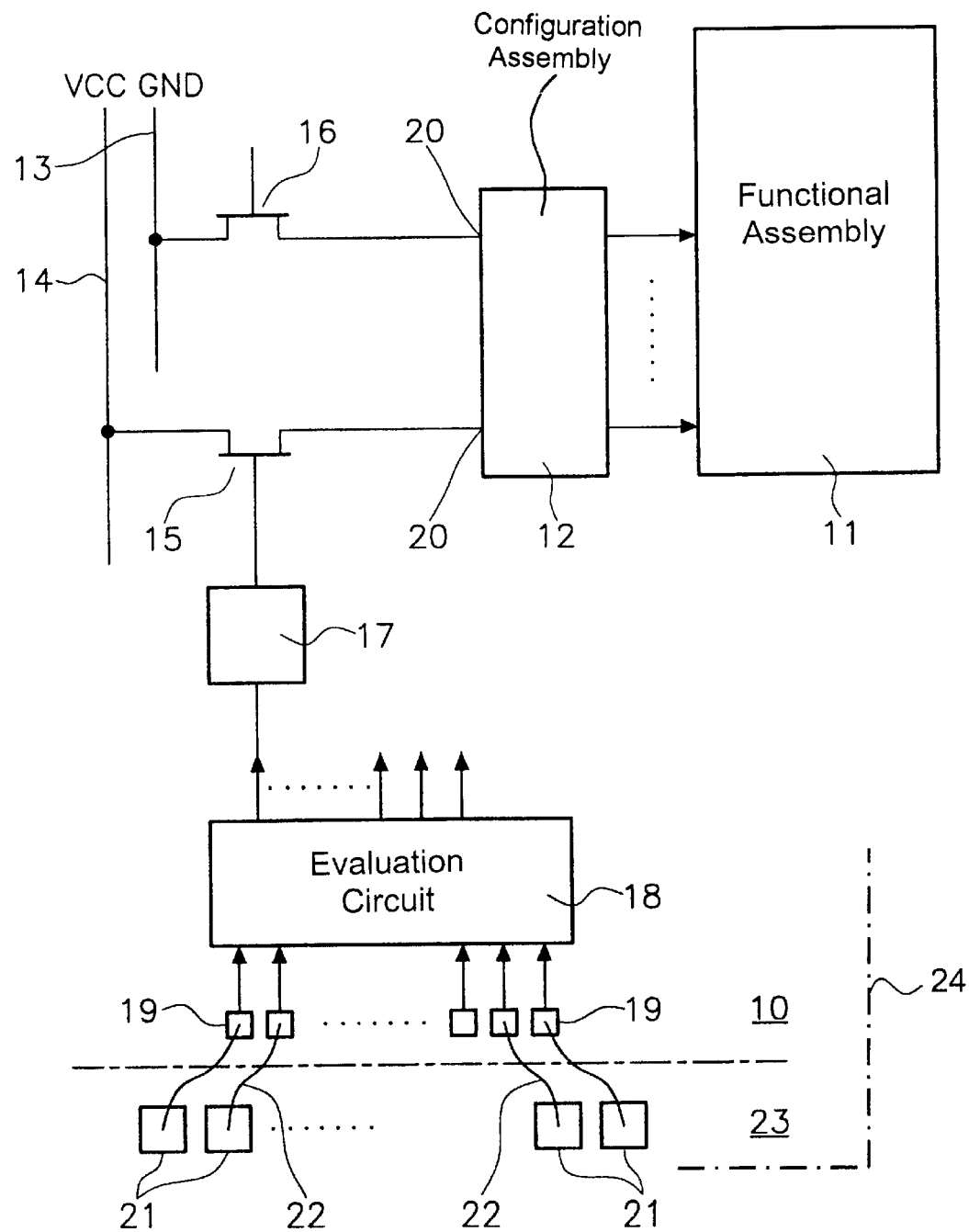

INTEGRATED CIRCUIT WITH A CONFIGURATION ASSEMBLY

BACKGROUND OF THE INVENTION

Field of the Invention

The invention lies in the field of integrated technology. More specifically, the invention relates to an integrated circuit arrangement having pads for producing external connections, for example by means of bonding, having a functional assembly, for example a memory, and having a configuration assembly for the configuration of the functional assembly. The configuration assembly has control inputs, at least one control voltage being applied to the control inputs of the configuration assembly.

Integrated circuits are usually embodied on a chip in such a way that they can be optionally used for different operating voltages, operating modes and for memories having different memory organizations and the like. These configurations have to be definitively defined, in a manner dictated by the system, in a relatively early production step. By way of example, the positive supply potential can be set at 3 volts or 5 volts. Furthermore, for example the timing of a memory e.g. EDO (Enhanced Data Out) or FPM (Fast Page Mode) is configured. For configuration purposes, there are a configuration assembly and also metallic contact areas on the chip, which are referred to as pads. In connection with the configuration, they are referred to as functional pads below.

The configuration is effected by applying a specific control voltage to the functional group, by the functional pads being put at one of the supply potentials; e.g. GND or VCC, by means of bonding, or by blowing fuses, if the relevant control input is to be left open. After the configuration, the integrated circuit arrangement including the functional pads is enclosed in a housing and the configuration can then no longer be changed. The long lead time compared with the subsequent final completion of the relevant module and delivery has the disadvantage that it is not possible to react in the short term to changes in the market and to changes in the pattern of demand. However, for obvious reasons it would be desirable to perform the configuration as far as possible only when the market for the relevant product is favorable.

SUMMARY OF THE INVENTION

It is accordingly an object of the invention to provide an integrated circuit with a configuration assembly, which overcomes the above-mentioned disadvantages of the heretofore-known devices and methods of this general type and which allows configuring to be carried out as far as possible only in the final phase of the production process for the associated module.

With the foregoing and other objects in view there is provided, in accordance with the invention, an integrated circuit, comprising:

a plurality of pads for contacting the integrated circuit with external terminal connections, for instance via bonding;

a functional assembly of the integrated circuit, such as a memory, and a configuration assembly connected to the functional assembly for configuring the functional assembly, the configuration assembly having control inputs for receiving at least one control voltage;

at least one integrated switch connected between the control inputs of the configuration assembly and a control voltage source, the integrated switch having a control side connection;

an evaluation circuit having an input side connected to at least one of the plurality of pads and an output side connected to the control side connection of the switch, the evaluation circuit detecting a configuration signal present at the at least one pad and applying a control signal for the switch.

In other words, the inputs of the configuration assembly can be connected to the control voltage via one or more integrated switches, that, on the control side, are connected to an evaluation circuit. The evaluation circuit, on the input side, is connected to at least one pad, and the evaluation circuit detects a configuration signal present at the pad and converts it into a control signal for the switch.

The invention has the advantage that the configuration can still be carried out even when the integrated circuit arrangement has already been enclosed in the housing. In the course of the production process, the configuration can then be effected for example as late as in the phase of final testing. As a result, the logistical flexibility during production is significantly increased and attention can be given more easily to customer requirements and market fluctuations. As a result of the configuration put back in time, the preceding process steps in the production of the integrated circuit arrangement are standardized and the process sequence is thus simplified.

In accordance with an added feature of the invention, a non-volatile memory for storing the control signal is connected between the switch and the evaluation circuit. The switch state and thus the configuration are fixed in this way.

In accordance with an additional feature of the invention, the evaluation circuit detects and converts an analog input signal.

In accordance with another feature of the invention, the evaluation circuit is connected to a plurality of the pads.

In principle, the programming is possible in various ways. Defined signal patterns or signals having a specific time response can be applied in a programming mode. As an alternative, it is also possible for specific supply voltages to be applied in a constant fashion. In many applications it will be appropriate to code the patterns and signals digitally. However, it may be particularly expedient for an analog input signal to be applied to the evaluation circuit and, accordingly, for the evaluation circuit to be designed for the detection and conversion of an analog input signal. In this case, the invention encompasses the possibility both of the input signals being fed in serially via a single pad and of said signals being fed in in parallel via a plurality of pads.

In accordance with a preferred embodiment, the switch is a transistor. In principle, the embodiment of the switch and of the control arrangement is determined by the process technology used to produce the integrated circuit arrangement. A particularly simple embodiment for the switch is for it to be designed as a transistor. The control arrangement is preferably designed as a flash memory cell or in another technological embodiment which is usually used for writable memories (PROMs).

With the above and other objects in view there is also provided, in accordance with the invention, an integrated circuit device which comprises the above-summarized integrated circuit combined with a lead frame having pins contact-connected to the pads, and a housing commonly encapsulating the circuit and the lead frame.

Other features which are considered as characteristic for the invention are set forth in the appended claims.

Although the invention is illustrated and described herein as embodied in an integrated circuit arrangement having a configuration assembly, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The single FIGURE is a schematic diagram of an integrated circuit arrangement in conjunction with pins of a lead frame.

DESCRIPTION OF THE PREFERRED EMBODIMENT

Referring now to the sole FIGURE of the drawing in detail, there is shown a partial region of a chip 10 with an integrated circuit. The latter comprises a functional assembly 11, which, by way of example, may involve the functions and circuits of a semiconductor memory. For the configuration of the memory, moreover, there is a configuration assembly 12 known per se on the chip 10. This may involve, for example, a voltage regulator, an assembly for controlling the time response (timing) or for controlling the word width in the case of a memory. In addition, interconnects or conductor tracks 13, 14 for the supply potentials GND and VCC, respectively, are situated on the chip 10.

In the illustrated exemplary embodiment, the configuration assembly 12 can be selectively connected to the conductor track 14 via a first transistor 15 and to the conductor track 13 via a second transistor 16. The control inputs of each transistor 15, 16 are connected to the control outputs of an evaluation circuit 18 via a non-volatile memory 17. In order to maintain clarity in the illustration, only the memory 17 for the transistor 15 is illustrated. The number of transistors 15, 16 illustrated in the drawing and their linking to the conductor tracks 13, 14 should be understood only as an example. It goes without saying that other alternatives are possible here which can be realized in a manner depending on the design and function of the selected configuration assembly 12.

The evaluation circuit 18 is an electronic assembly which can be programmed by the application of electrical signals. The programmed state is stored in a non volatile fashion in the memory 17. An example which is highly suitable for this purpose is a flash memory cell or, if appropriate, another embodiment which is used for writable memories (PROMs).

The inputs of the evaluation circuit 18 are connected to pads 19, which are, in turn, contact-connected via bonding wires 22 to pins 21 of a metallic lead frame 23. The external electrical signals for programming can be fed in via the pins 21 if the chip 10 and the remaining part of the lead frame 23 are encapsulated in a housing 24, which is diagrammatically indicated in the FIGURE.

For the configuration of the functional assembly 11, depending on the parameters to be set, the control inputs 20 of the configuration assembly 12 are optionally connected to the associated conductor track 13, 14 or supply potential VCC or GND, or no connection is produced. For this purpose, the evaluation circuit 18 is programmed by external signals applied to the pins 21 in such a way that the transistor 15 and/or 16 is correspondingly turned on or turned off. For this purpose, the evaluation circuit 18 detects the applied signal, evaluates it and converts it into a control signal for the transistors 15, 16.

The pins 21 and pads 19 can either be provided exclusively for carrying out the configuration. However, it is also possible to allocate them for other functions of the integrated circuit arrangement 12, with the result that they can have multiple allocation and multiple functions depending on the programming mode.

I claim:

1. An integrated circuit, comprising:

a plurality of pads for contacting the integrated circuit;

a functional assembly of the integrated circuit and a configuration assembly connected to said functional assembly for configuring said functional assembly, said configuration assembly having control inputs for receiving at least one control voltage;

at least one integrated switch connected between said control inputs of said configuration assembly and a control voltage source, said integrated switch having a control side connection;

an evaluation circuit having an input side connected to at least one of said plurality of pads and an output side connected to said control side connection of said switch, said evaluation circuit detecting a configuration signal present at said at least one pad and applying a control signal for said switch.

2. The circuit according to claim 1, wherein said pads are adapted to be contacted by bonding.

3. The circuit according to claim 1, wherein said functional assembly is a memory.

4. The circuit according to claim 1, which comprises a non-volatile memory for storing the control signal connected between said switch and said evaluation circuit.

5. The circuit according to claim 1, wherein said evaluation circuit is adapted to detect and convert an analog input signal.

6. The circuit according to claim 1, wherein said evaluation circuit is connected to a plurality of said pads.

7. The circuit according to claim 1, wherein said switch is a transistor.

8. The circuit according to claim 1, which comprises a flash memory cell for storing the control signal connected between said switch and said evaluation circuit.

9. An integrated circuit device, comprising the circuit according to claim 1, a lead frame having pins contact-connected to said pads, and a housing commonly encapsulating said circuit and said lead frame.

* * * * *